US009022214B2

(12) United States Patent
Lai et al.

(10) Patent No.: US 9,022,214 B2
(45) Date of Patent: May 5, 2015

(54) CLAMP (75) Inventors: Tu-Fu Lai, Taoyuan Hsien (TW); Zhon Gren Zhu, Jiang Su (CN); Mok Mei, Jiang Su (CN); Chun-Chieh Hung, Taoyuan Hsien (TW)

(73) Assignees: Preoptix (Jiangsu) Co., Ltd., Zhen Jiang, Jiang Su (CN); Delta Electronics, Inc., Taoyuan Hsien (TW)

( * ) Notice: Subject to any disclaimer, the term of this patent is extended or adjusted under 35 U.S.C. 154(b) by 290 days.

(21) Appl. No.: 13/345,095

(22) Filed: Jan. 6, 2012

(65) Prior Publication Data

US 2012/0193497 A1 Aug. 2, 2012

(30) Foreign Application Priority Data

Jan. 31, 2011 (CN) .......................... 2011 1 0037436

(51) Int. Cl.
| | |
|---|---|
| *B65D 85/48* | (2006.01) |
| *B60P 3/00* | (2006.01) |
| *C03B 35/20* | (2006.01) |
| *B25B 5/10* | (2006.01) |
| *C23C 14/50* | (2006.01) |
| *B25B 5/14* | (2006.01) |

(52) U.S. Cl.
CPC ................ *B65D 85/48* (2013.01); *B60P 3/002* (2013.01); *C03B 35/202* (2013.01); *B25B 5/10* (2013.01); *C23C 14/50* (2013.01); *C03B 35/20* (2013.01); *C03B 35/207* (2013.01); *B25B 5/14* (2013.01); *B25B 5/145* (2013.01)

(58) Field of Classification Search
CPC ............ B25B 5/14; B25B 5/10; C03B 35/20; C03B 35/202; C03B 35/207; C23C 14/50; B65D 85/48; B60P 3/002

USPC ............ 248/229.12, 229.22, 231.41, 220.31, 248/221.11, 689, 473; 206/449

See application file for complete search history.

(56) References Cited

U.S. PATENT DOCUMENTS

| | | | | | |
|---|---|---|---|---|---|
| 1,150,455 | A | * | 8/1915 | Rudolph et al. | ............... 206/451 |
| 2,009,431 | A | * | 7/1935 | Black | ............. 269/296 |
| 2,761,556 | A | * | 9/1956 | Yardley | ......... 206/451 |
| 2,943,733 | A | * | 7/1960 | Poeschl et al. | .............. 206/452 |
| 2,950,001 | A | * | 8/1960 | Bucko | ............ 206/454 |
| 3,602,367 | A | * | 8/1971 | Nathan et al. | ................ 206/454 |
| 3,603,455 | A | * | 9/1971 | Bareiss | ........... 206/454 |
| 4,077,792 | A | * | 3/1978 | Calevro et al. | ................ 65/288 |
| 4,246,222 | A | * | 1/1981 | Monthony | .................. 264/219 |
| 4,429,791 | A | * | 2/1984 | Ruppel et al. | ................ 206/454 |
| 5,003,729 | A | * | 4/1991 | Sherby | ............ 451/38 |
| 5,326,147 | A | * | 7/1994 | Watson | ........... 294/162 |

(Continued)

FOREIGN PATENT DOCUMENTS

| | | |
|---|---|---|
| CN | 2794120 Y | 7/2006 |
| GB | 2496931 B * | 11/2013 |

(Continued)

*Primary Examiner* — Terrell McKinnon
*Assistant Examiner* — Eret McNichols
(74) *Attorney, Agent, or Firm* — Muncy, Geissler, Olds & Lowe, P.C.

(57) ABSTRACT

A clamp is provided. The clamp comprises a frame and a movable structure. The movable structure is detachably connected with the frame to define a receiving space for receiving at least one substrate. After sliding along a surface of the frame to a suitable position, the movable structure is adapted to be fastened together with the frame to fix the at least one substrate in the receiving space.

10 Claims, 6 Drawing Sheets

(56) References Cited

U.S. PATENT DOCUMENTS

| | | | | |
|---|---|---|---|---|
| 5,595,301 | A * | 1/1997 | Putz et al. | 206/449 |
| 5,909,808 | A * | 6/1999 | Bartholomew | 206/451 |
| 6,077,152 | A * | 6/2000 | Warehime | 451/75 |
| 6,811,131 | B2 * | 11/2004 | Kuo | 248/346.03 |
| 7,658,285 | B2 * | 2/2010 | Hagan et al. | 206/448 |
| 7,918,221 | B2 * | 4/2011 | Warfield et al. | 126/623 |
| 8,083,912 | B2 * | 12/2011 | Klug et al. | 204/298.15 |
| 8,517,361 | B2 * | 8/2013 | Sambuceto et al. | 269/37 |
| 8,601,651 | B2 * | 12/2013 | Christen | 24/569 |
| 2005/0103669 | A1 * | 5/2005 | Fukui et al. | 206/449 |
| 2007/0068802 | A1 * | 3/2007 | Gebele et al. | 204/298.02 |
| 2007/0069351 | A1 * | 3/2007 | Klug et al. | 257/678 |
| 2009/0090652 | A1 * | 4/2009 | Torikai et al. | 206/587 |
| 2009/0291203 | A1 * | 11/2009 | Hagi et al. | 427/126.3 |
| 2012/0048186 | A1 * | 3/2012 | Bruning et al. | 118/500 |
| 2012/0183683 | A1 * | 7/2012 | Mitsumori et al. | 427/162 |
| 2014/0260431 | A1 * | 9/2014 | Nitschke et al. | 65/106 |

FOREIGN PATENT DOCUMENTS

| | | |
|---|---|---|
| TW | M356620 | 5/2009 |
| TW | M356742 | 5/2009 |

* cited by examiner

CLAMP

This application claims priority to Chinese Patent Application No. 201110037436.4 filed on Jan. 31, 2011.

CROSS-REFERENCES TO RELATED APPLICATIONS

Not applicable.

BACKGROUND OF THE INVENTION

1. Field of the Invention

The present invention relates to a clamp, and more particularly, to a clamp whose length can be flexibly adjusted.

2. Descriptions of the Related Art

Over recent years, materials with high light transmissivity such as glass have found wide application in, for example, panels and optical products. However, the glass is fragile and is liable to damage when being impacted, so to reduce the probability of damage to edges of the glass during the manufacturing process, the glass in the form of a substrate is usually fixed by a clamp first before subsequent processes such as film plating, drilling and polishing are performed thereon by using other production facilities.

Figure 1:
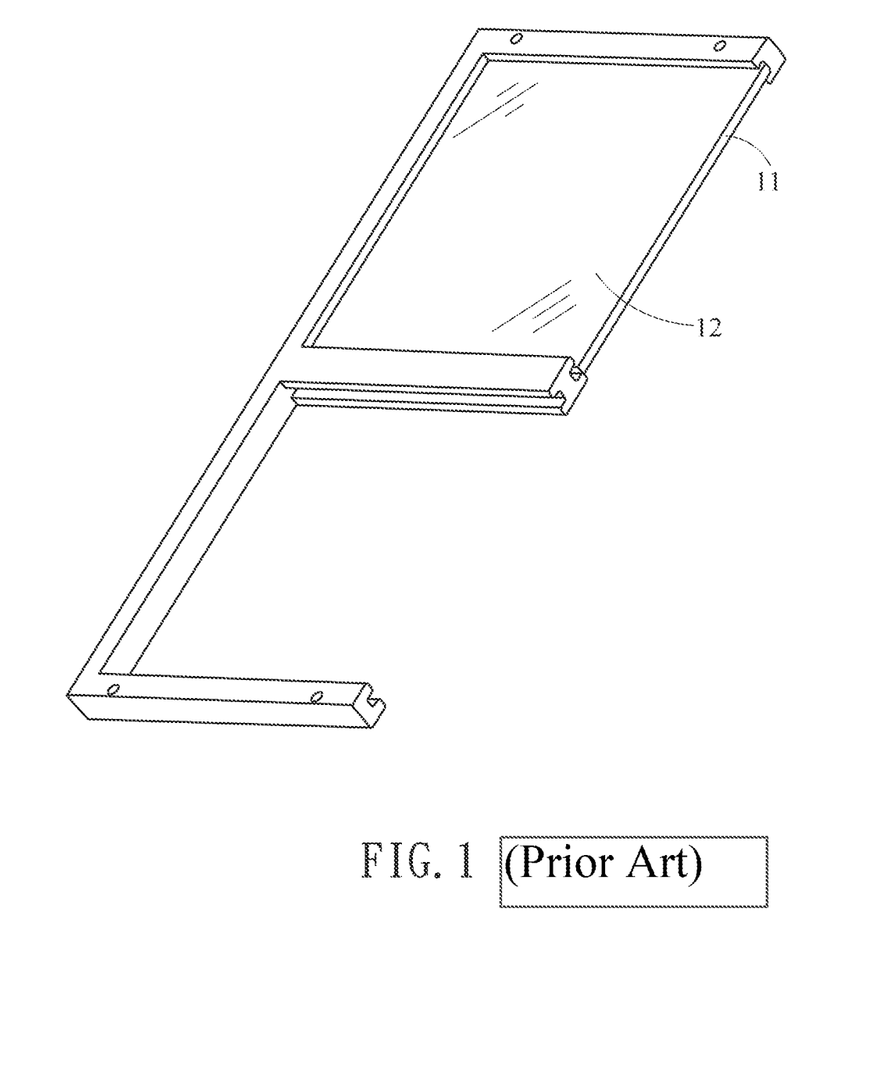
FIG. 1 is a schematic view of a conventional clamp when assembled with a substrate.

FIG. 1 illustrates a schematic view of a clamp 1 for fixing a glass substrate 11. The clamp 1 is shaped into an E form, and is adapted to define at least one receiving space 12 for receiving at least one glass substrate 11. It shall be particularly appreciated that, in practice, the glass substrate 11 is usually of a fixed width, while the length thereof varies depending on requirements of the final products. However, because the length of the clamp 1 is unadjustable, the clamp 1 cannot be used for glass substrates of different lengths; and moreover, during the manufacturing process, an additional process must be performed to slice the glass substrate 11 into a fixed size so that it can be received in the receiving space 12.

Accordingly, an urgent need exists in the artto provide a clamp capable of fixing glass substrates of various sizes to appropriately protect the integrity of the glass substrates.

SUMMARY OF THE INVENTION

To solve the aforesaid problem, an objective of the present invention is to provide a clamp that can overcome the shortcoming of the conventional clamps with unadjustable lengths to simplify the manufacturing process and save production costs.

To achieve the aforesaid objective, the clamp of the present invention comprises a frame and a movable structure. The movable structure is adapted to be detachably connected with the frame to define a receiving space for receiving at least one substrate. After sliding along a surface of the frame to a suitable position, the movable structure is adapted to be fastened together with the frame to fix at least the substrate in the receiving space. Thereby, the clamp according to the present invention is capable of fixing substrates of various sizes.

The benefit of the technology of the present invention compared with the conventional clamp is that the clamp of the present invention is capable of fixing substrates of various lengths and covering the edge of the fragile substrate effectively in the manufacturing process to reduce the external stress applied on the fragile substrate and to protect the integrality of the substrate. Consequently, the clamp of the present invention can increase the yield, simplify the manufacturing process and decrease the production cost.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 2A:
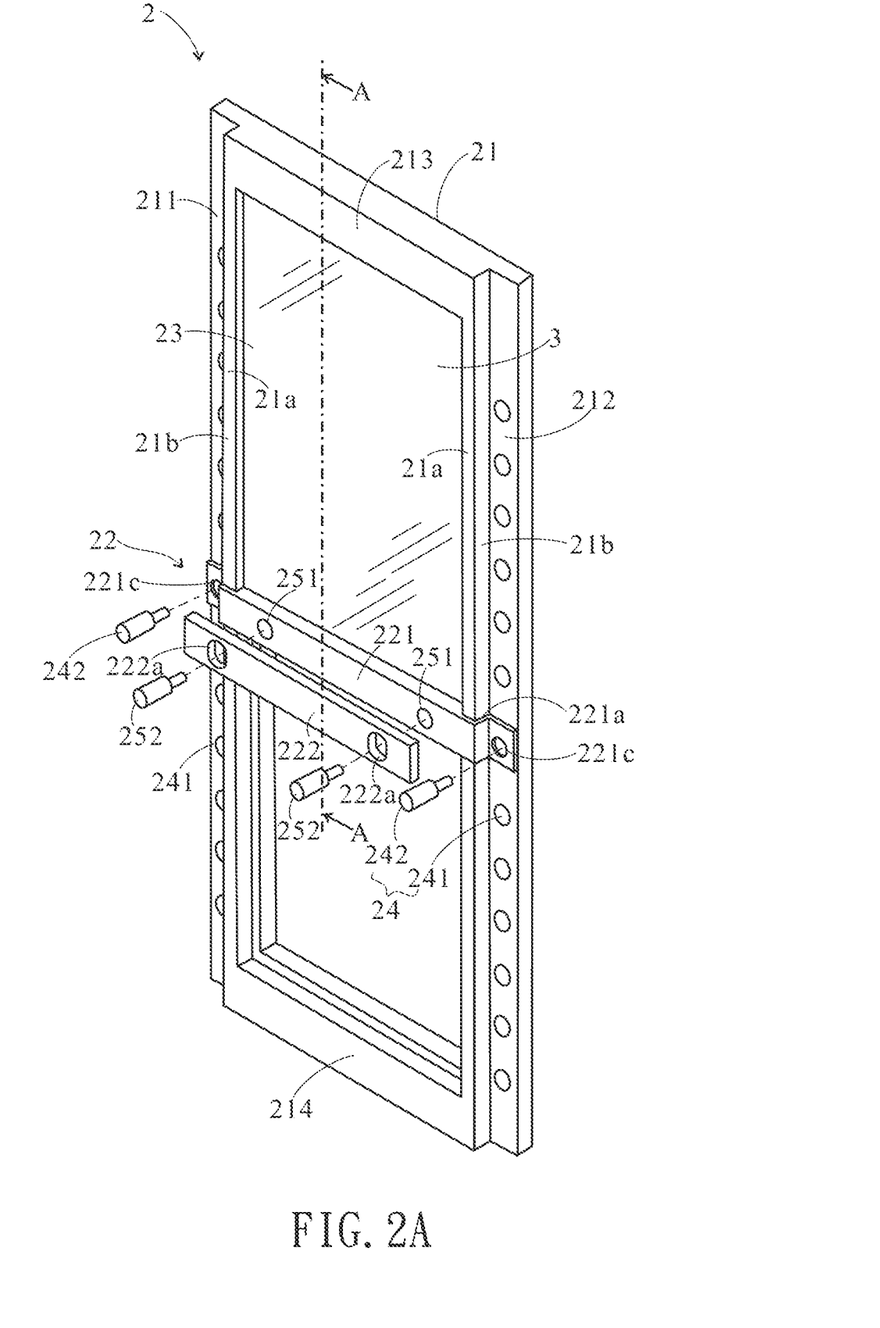
FIG. 2A is a schematic assembly view of a clamp according to an embodiment of the present invention when assembled with a substrate.

Accordingly, to protect fragile substrates effectively, the present invention provides a clamp 2. FIG. 2A illustrates a schematic view of a clamp 2 according to an embodiment of the present invention when assembled with a substrate 3. The clamp 2 comprises a frame 21 and a movable structure 22 which is detachably connected with the frame 21 to define a receiving space 23 for receiving at least the substrate 3. The substrate 3 may be a glass substrate. After sliding along a surface 21a of the frame 21 to an appropriate position according to a length of the substrate 3, the movable structure 22 is adapted to partially abut against the substrate 3 and then be fastened together with the frame 21. In this way, an edge of the substrate 3 can be covered completely by the clamp 2 so that when the clamp 2 is further used with other production facilities, a fracture in the substrate 3 due to the impact of the edge of the substrate 3 can be avoided during the related manufacturing processes such as the film plating of the substrate 3.

Figure 2B:
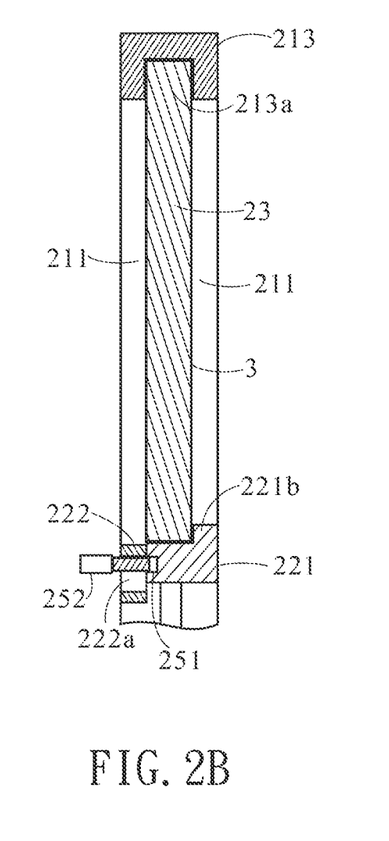
FIG. 2B is a schematic partial cross-sectional view of the clamp along line A-A in FIG. 2A according to an embodiment of the present invention when assembled with the substrate.
Figure 2C:
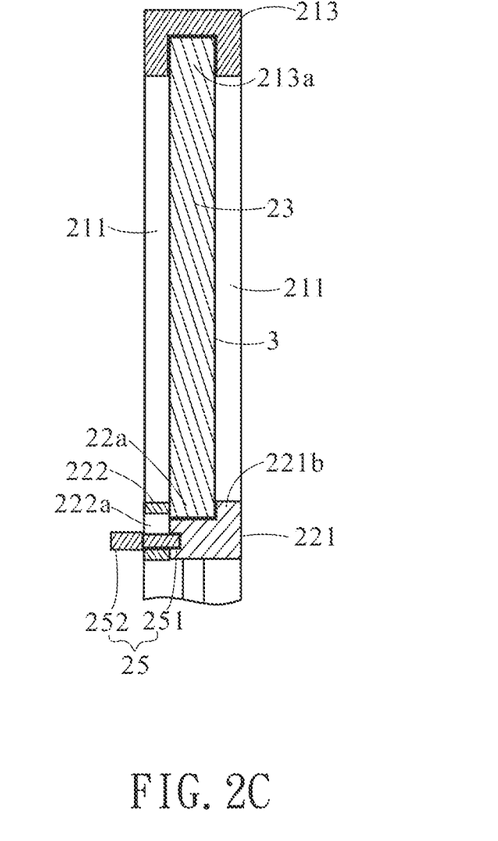
FIG. 2C is another schematic partial cross-sectional view of a clamp along line A-A in FIG. 2A according to an embodiment of the present invention when assembled with a substrate.

Specifically, with reference to FIGS. 2A, 2B and 2C, FIGS. 2B and 2C are schematic partial cross-sectional views of the clamp 2 along line A-A in FIG. 2A according to the present invention when assembled with the substrate 3. The relations among a third shaft body 213, a sliding shaft 221, a baffle 222 and the substrate 3 are shown clearly in FIGS. 2B and 2C. As shown in FIG. 2A, the movable structure 22 comprises the sliding shaft 221 and the baffle 222. As shown in FIGS. 2B and 2C, the sliding shaft 221 comprises a protrusion 221b, and the baffle 222 is detachably disposed on the sliding shaft 221. The frame 21 is formed by connecting a first shaft body 211, a second shaft body 212 opposite to the first shaft body 211, and a third shaft body 213. After the sliding shaft 221 slides along the surface 21a of the frame 21 to the appropriate position, a first groove 213a of the third shaft body 213, the second shaft body 212, the first shaft body 211 and the sliding shaft 221 are adapted to define the receiving space 23. The edge of the substrate 3 is disposed in the receiving space 23 and abuts against the protrusion 221b (as shown in FIG. 2B). Next, the sliding shaft 221 can be fastened to the first shaft body 211 and the second shaft body 212 respectively. As shown in FIG. 2C, the baffle 222 may be further moved to associate with the sliding shaft 221 to further define a second groove 22a. As a result, the edge of the substrate 3 is received partially in the first groove 213a and partially in the second groove 22a. Then, the baffle 222 is further fastened to the sliding shaft 221 to make sure that the substrate 3 is fixed in the receiving space 23.

Figure 3:
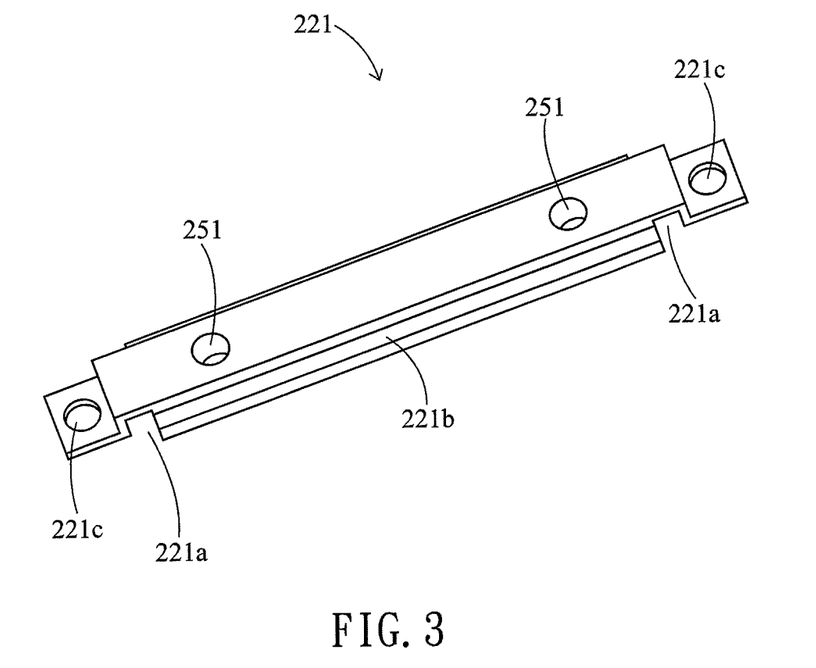
FIG. 3 is a schematic view of a sliding shaft of the clamp according to an embodiment of the present invention.
Figure 4:
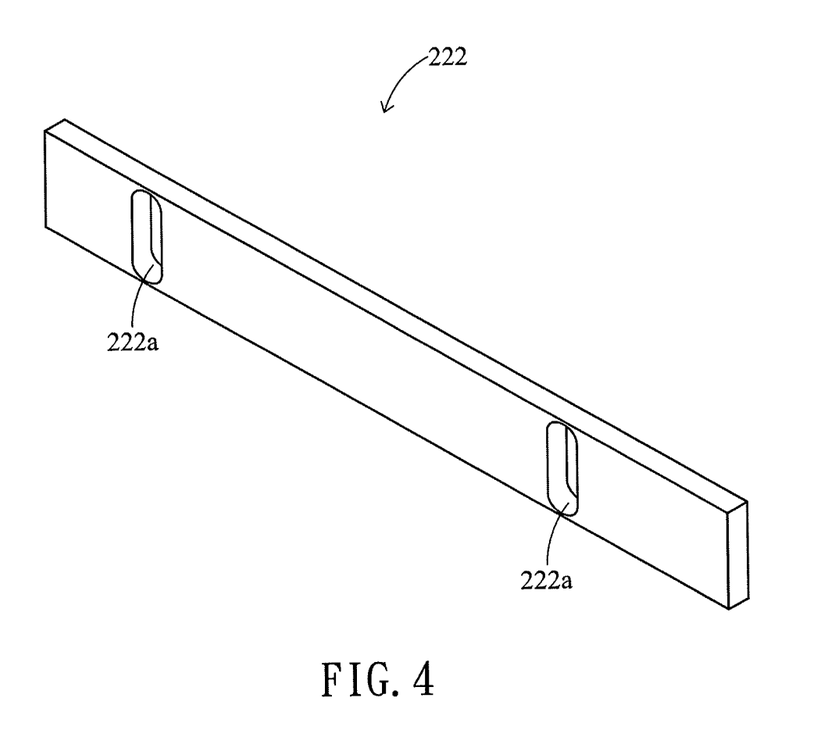
FIG. 4 is a schematic view of a baffle of the clamp according to an embodiment of the present invention.

In reference to both FIGS. 2A and 3, FIG. 3 is a schematic view of the sliding shaft 221. In this embodiment, each of two ends of the sliding shaft 221 has a first engagement structure 221a, while the first shaft body 211 and the second shaft body 212 each have a second engagement structure 21b respectively. When each of the first engagement structures 221a is engaged with the corresponding second engagement structure 21b, the sliding shaft 221 is adapted to connect with the first shaft body 211 and the second shaft body 212 and to slide on the surface 21a of the frame 21 formed by the first shaft body 211 and the second shaft body 212 with respect to the third shaft body 213. Thereby, the sliding shaft 221 can slide to the appropriate position with respect to the third shaft body 213 according to the length of the substrate 3 so that the protrusion 221b of the sliding shaft 221 abuts against the substrate 3 (as shown in FIG. 2B), and then the sliding shaft 221 is fastened together with the first shaft body 211 and the second shaft body 212. It shall be appreciated that in this embodiment, each of the first engagement structures 221a is a recess, and each of the second engagement structures 21b is an emboss. However, as will be readily appreciated by people skilled in the art, it is also possible that each of the first engagement structures 221a is an emboss, while the second engagement structure 21b corresponding to the first engagement structure 221a is a recess in other embodiments of the present invention; these components will not be further described herein.

As described above, the sliding shaft 221 is fastened together with the first shaft body 211 and the second shaft body 212 by means of a first latch set 24 of the clamp 2. Specifically, as shown in FIG. 2A, the clamp 2 comprises the first latch set 24. The first latch set 24 has a plurality of first threaded holes 241 and a plurality of first screws 242, and the first threaded holes 241 are formed in the first shaft body 211 and the second shaft body 212 respectively at intervals. As shown in FIG. 3, the sliding shaft 221 has a plurality of openings 221c formed at the two ends of the sliding shaft 221. When the sliding shaft 221 slides to the appropriate position with respect to the third shaft body 213, the openings 221c are corresponding to the threaded holes 241 respectively; and then the first screws 242 are fastened into the first threaded holes 241 respectively through the openings 221c to fix the sliding shaft 221 onto the first shaft body 211 and the second shaft body 212.

In reference to FIGS. 2A, 2B, 2C and 4, FIG. 4 is a schematic structural view of the baffle 222 according to the present invention. In this embodiment, the clamp 2 comprises a second latch set 25. The second latch set 25 has two second threaded holes 251 formed in the sliding shaft 221 and two second screws 252, while the baffle 222 has two sliding grooves 222a. When each of the second screws 252 is fastened into the corresponding second threaded hole 251 to a suitable depth (the depth is larger than a thickness of the baffle 222) through each of the sliding grooves 222a as shown in FIG. 2B, the second screw 252 is adapted to move in the corresponding sliding groove 222a; i.e., the baffle 222 not only comes into contact with the sliding shaft 221 but also can slide onto the sliding shaft 221. As shown in FIG. 2C, after the baffle 222 slides onto the sliding shaft 221 to such an extent that it comes into contract with the protrusion 221b to define the second groove 22a, each of the second screws 252 is fastened into the corresponding second threaded hole 251 through the corresponding sliding groove 222a to fix the baffle 222 onto the sliding shaft 221. In this way, the edge of the substrate 3 is received partially in the first groove 213a and partially in the second groove 22a so that the substrate 3 can be fixed in the clamp 2 to be subjected to subsequent manufacturing processes. After all manufacturing processes have been completed, by simply loosening the second screws 252 slightly and moving the second screws 252 to the appropriate depth, the baffle 222 can be slid further away from the substrate 3 so that the substrate 3 can be taken out from the clamp 2 easily.

It shall be appreciated that it is also possible that the second latch set 25 only has at least one second threaded hole 251 and at least one second screw 252, while the baffle 222 only has at least one sliding groove 222a in other embodiments of the present invention; and this will be appreciated by those skilled in the art and, thus, will not be further described herein. In this embodiment, to strengthen the structural strength of the frame 21, the frame 21 further comprises a fourth shaft body 214 opposite to the third shaft body 213. The fourth shaft body 214 connects with the first shaft body 211 and the second shaft body 212 respectively to form a rectangular frame 21 that is integrally formed. However, in other embodiments of the present invention, the frame 21 may only comprise the first shaft body 211, the second shaft body 212 and the third shaft body 213.

According to the above descriptions, as compared with the conventional clamp, the clamp of the present invention is capable of fixing substrates of various lengths and covering the edge of the fragile substrate effectively in the manufacturing process to reduce the external stress applied on the fragile substrate and to protect the integrity of the substrate. Consequently, the clamp of the present invention can increase the yield, simplify the manufacturing process and decrease the production cost.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A clamp for receiving and holding at least one substrate, the clamp comprising:
    a frame, having a framed surface and comprising:
        a first shaft body, having a first upper surface;
        a second shaft body, disposed opposite to the first shaft body and having a second upper surface; and
        a third shaft body, connecting with the first shaft body and the second shaft body and having a third upper surface and an inner side all surface being vertical to the third upper surface, wherein the framed surface is defined by the first upper surface, the second upper surface and the third upper surface, and a first groove is formed on the inner sidewall surface of the third shaft body;
    a movable structure, having a sliding shaft and being detachably disposed across the first shaft body and the second shaft body to define a receiving space for receiving the at least one substrate; and
    a first latch set having a plurality of first threaded holes and a plurality of first screws, the first threaded holes being formed in the first shaft body and the second shaft body respectively, and the sliding shaft having a plurality of openings, wherein the sliding shaft of the movable structure is capable of sliding along the first upper surface of the first shaft body and the second upper surface of the second shaft body in a suitable position with respect to the third shaft body so as to fix the at least one substrate in the receiving space, and the openings of the sliding shaft are corresponding to the threaded holes of the first latch set respectively, and each of the screws is fastened into each of the threaded holes through each of the opening to fix the sliding shaft on the first shaft body and the second shaft body, and wherein the first groove of the third shaft body, the second shaft body, the first shaft body and the sliding shaft define the receiving space thereby one edge of the substrate is received completely within the first groove.

2. The clamp as claimed in claim 1, wherein each of two ends of the sliding shaft has a first engagement structure, the first shaft body and the second shaft body have a second engagement structure respectively, and when the first engagement structure is engaged with the second engagement structure, the sliding shaft is adapted to connect with the first shaft body and the second shaft body to slide on the first upper surface and the second upper surface with respect to the third shaft body.

3. The clamp as claimed in claim 2, wherein after the sliding shaft slides to the suitable position with respect to the third shaft body, the sliding shaft is adapted to abut against the at least one substrate, and is adapted to be fastened together with the first shaft body and the second shaft body respectively.

4. The clamp as claimed in claim 3, wherein the movable structure comprises a baffle being detachably disposed on the sliding shaft, the sliding shaft has a protrusion, the baffle and the protrusion define a second groove being opposite to the first groove, and the two edges of the at least one substrate are received in the first groove and the second groove respectively so as to be fixed in the receiving space.

5. The clamp as claimed in claim 1, comprising a second latch set having at least one second threaded hole formed in the sliding shaft and at least one second screw, the baffle having at least one sliding groove, wherein when the second screw is fastened into the second threaded hole to a suitable depth through the at least one sliding groove, the second screw is adapted to move in the at least one sliding groove, and thus the baffle is adapted to slide on the sliding shaft.

6. The clamp as claimed in claim 5, wherein after the baffle slides on the sliding shaft to cooperate with the protrusion to define the second groove, the second screw is fastened into the second threaded hole through the at least one sliding groove to fix the baffle on the sliding shaft.

7. The clamp as claimed in claim 6, wherein the first engagement structure is a recess, and the second engagement structure is an emboss.

8. The clamp as claimed in claim 7, wherein the at least one substrate is a glass substrate.

9. The clamp as claimed in claim 8, wherein the frame further comprises a fourth shaft body, and the fourth shaft body is opposite to the third shaft body and connects with the first shaft body and the second shaft body respectively to form a rectangular form of the frame.

10. The clamp as claimed in claim 9, wherein the frame is formed integrally.

* * * * *